United States Patent
Naum et al.

[11] Patent Number: 5,920,765
[45] Date of Patent: Jul. 6, 1999

[54] IC WAFER-PROBE TESTABLE FLIP-CHIP ARCHITECTURE

[76] Inventors: Michael Naum, 2 Independence Dr., Tyngsborough, Mass. 01879; David H. Bassett, 6361 Janary Way, San Jose, Calif. 95129

[21] Appl. No.: 08/991,218

[22] Filed: Dec. 12, 1997

[51] Int. Cl.$^6$ ............................ G01R 31/26; H01L 21/66
[52] U.S. Cl. ................................. 438/18; 438/14; 438/17
[58] Field of Search .................................. 438/18, 17, 14

[56] References Cited

U.S. PATENT DOCUMENTS

| | | |
|---|---|---|
| 5,040,151 | 8/1991 | Miyawaki et al. . |
| 5,279,975 | 1/1994 | Devereaux et al. . |
| 5,286,656 | 2/1994 | Keown et al. . |
| 5,355,369 | 10/1994 | Greenberger et al. . |
| 5,781,560 | 7/1998 | Kawano et al. . |

Primary Examiner—Kevin M. Picardat
Assistant Examiner—Deven Collins

[57] ABSTRACT

The uppermost metal layer (metal-one) on a flip-chip packageable IC is modified to include at least one VCC pad, at least one ground pad, and at least one and preferably five test pads. Each pad is sized to be probe wafer-contactable, is and electrically coupled to appropriate vias formed in the IC. During IC fabrication but before the destination layer is fabricated, the IC is tested using a wafer probe that couples appropriate signals and power to the pads formed on the metal-one layer. If testing discloses a bug, it is possible to modify the IC metal-one traces, e.g., using FIB and then re-wafer probe test the IC. An insulating layer and destination layer may then be fabricated over what is known to be a good IC, and re-testing may occur. In this fashion, debugging diagnostics are made using testable ICs, and any metal-one revision may be tried and confirmed before changing the metal-one pattern for mass produced ICs. Preferably the IC includes a JTAG-compatible controller, and the metal-one layer includes five JTAG pads.

15 Claims, 3 Drawing Sheets

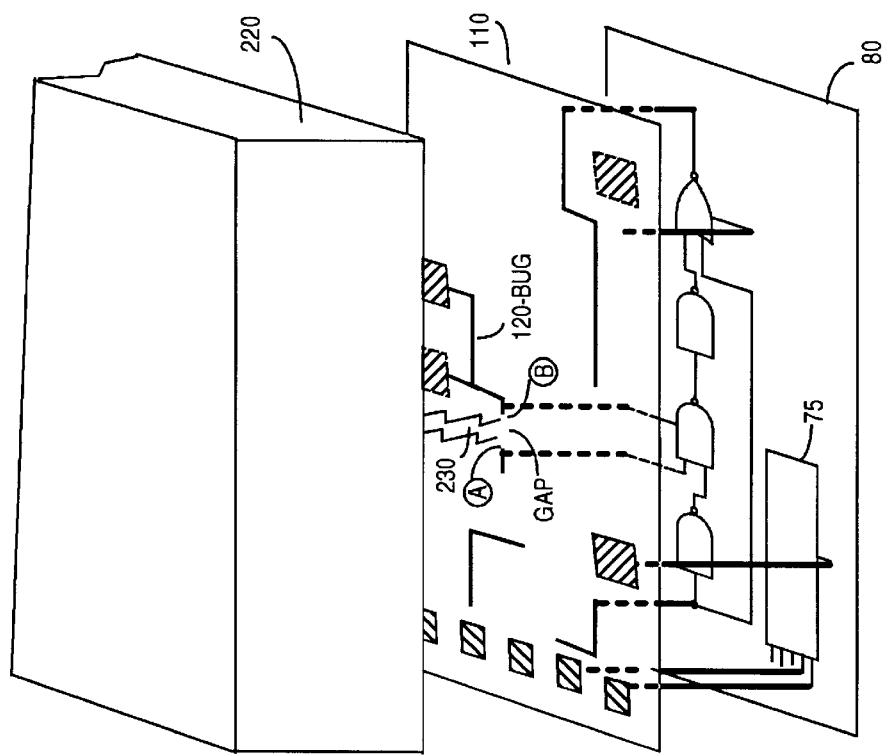
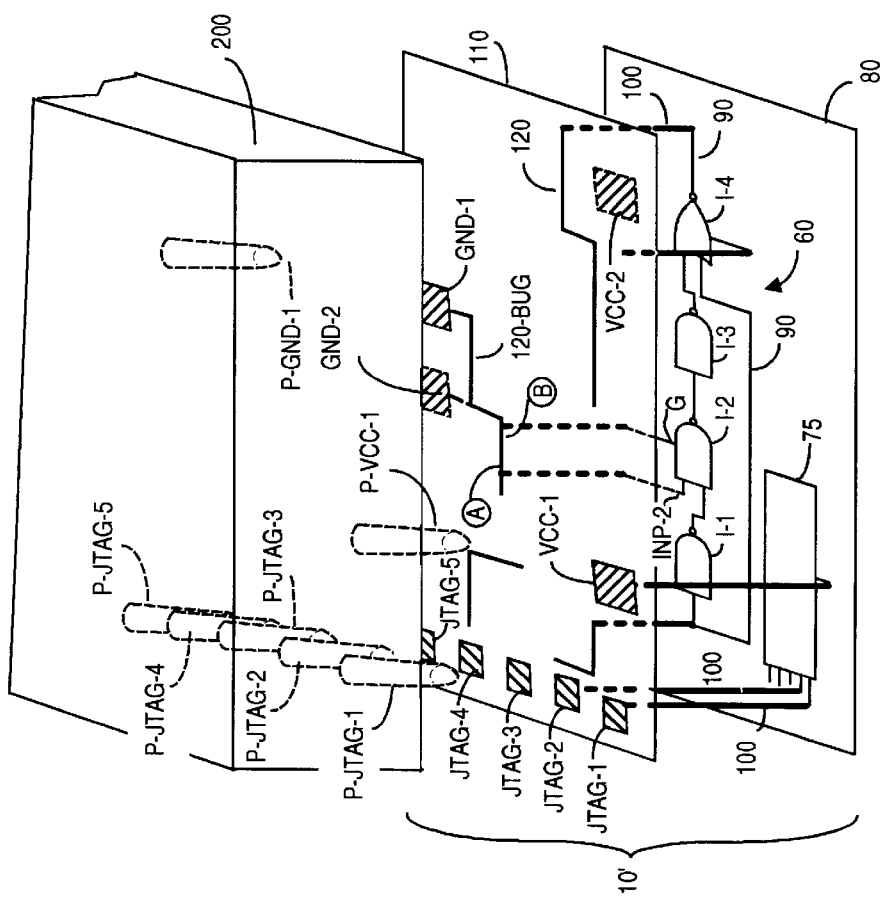

though it is understood that the configuration of FIG. 2 is
IC WAFER-PROBE TESTABLE FLIP-CHIP ARCHITECTURE

FIELD OF THE INVENTION

This invention relates to testing integrated circuits ("ICs"), and more specifically to wafer probe testing flip-chip architecture ICs before fabrication of the IC distribution layer.

BACKGROUND OF THE INVENTION

FIG. 1 depicts a flip-chip packaged IC, a form factor in which the packaged IC is flipped over top-for-bottom when mounting to a printed circuit board or other substrate. In FIG. 1, IC 10 is protectively contained with a package 20 from whose lower surface there protrudes a number of raised metallic solder bumps 30. These solder bumps are electrically coupled to various components and nodes within IC 10, and are used to bring operating potential, ground, and signals into IC 10, and to bring signals from IC 10, perhaps to other ICs mounted on substrate 40. In practice, there may be many thousands of such solder bumps disposed on the lower surface of package 20.

In mounting the packaged IC, solder bumps 30 are placed in contact with pads (not shown) on the upper surface of substrate 40 to which conductive leads 50 are electrically coupled. Typically a reflow solder technique is used to simultaneously solder all of bumps 30 to the underlying corresponding pads. While this mounting technique advantageously reduces inductance between the IC and the substrate traces, a major shortcoming is that one cannot wafer probe a flip-chip die. Instead, IC testing must be deferred until fabrication is complete. The reasons for this shortcoming will now be described.

FIG. 2 is a simplified representation of a generic IC 10, which is shown as including a logic circuit 60 and a controller circuit 70 fabricated on a "layer" 80. In reality, "layer" 80 comprises a great many layers, e.g., a semiconductor substrate layer that includes regions of dopant deposition, layers of oxide, layers of metallization and so forth. The various circuits comprising IC 10 may be fabricated using metal-oxide-semiconductor ("MOS") or complemental MOS (CMOS").

Shown on "layer" 80 are conductive traces 90 that can make electrical connection to one or more conductive vias that are normal to the plane of "layer" 80. Vias 100 make electrical connection to an overlying uppermost layer 110 of metallization (often called "metal-one") upon which are found various conductive traces 120. Not shown in FIG. 2 for ease of illustration is a power grid mesh layer that typically underlies the metal-one layer and provides a plurality of VCC and ground traces, according to vendor specification. These traces are via-coupled down to the IC, and are coupled upward to appropriate sites on the destination layer.

Signal carrying traces on the metal-one layer are perhaps 1 $\mu$m in width, while power carrying traces on the mesh layer (not shown) may be 100 $\mu$m wide, or greater, depending upon vendor specifications. In practice, some on the traces shown on "layer" 80 may in fact be formed on the metal-one layer.

Vias 100 can continue vertically upward through an insulating typically oxide layer 130 to a distribution layer 140. (Layer 130 is shown transparent, for ease of illustration.) Conductive landing sites 150 are formed on the distribution layer, to which sites are affixed the solder bumps 30 that are seen in FIG. 1. The upper left corner of FIG. 2 shows a few of the solder bumps spaced-apart from the distribution layer landing sites, for ease of understanding. Typically the size of landing sites 150 is perhaps 10 $\mu$m×10 $\mu$m, and while the sites will typically be formed in an array, it is not necessary that a site be located at every position in the array. It is understood that the configuration of FIG. 2 is packaged and then flipped top-for-bottom before mounting, as shown in FIG. 1.

Among the potentially thousands of landing sites 30 will be one or more sites to bring operating potential VCC to IC 10, e.g., landing site 30-VCC, one or more sites to bring ground to IC 10, e.g., landing site 30-GND, and one or more sites used optionally to monitor testing of IC 10 after fabrication, e.g., landing site 30-T.

A controller 70 is often included in ICs to implement on-chip testing of the fully fabricated IC. Unfortunately prior art flip-chip architecture does not permit wafer probe testing because landing sites 150 are simply too small (e.g., 10 $\mu$m×10 $\mu$m) to be contacted by pins on a wafer probe. (A wafer probe requires a target contact area sized to at least about 70 $\mu$m×70 $\mu$m.)

Thus, testing of IC 10 can occur only after packaging is complete, with VCC power, ground, and test signals coupled to the IC through bumps 30 on the destination layer 140. Simply stated, until fabrication is complete and the distribution layer is in place, one cannot bring VCC or ground or test signals into or out of the integrated circuit. One cannot test before fabricating the destination layer because the surface of vias 100 that would be available through the insulation layer 130 are simply too small (e.g., perhaps only 1.4 $\mu$m×1.4 $\mu$m) to accommodate contact with pins from a wafer probe unit.

To appreciate the difficulties posed by the inability to test flip chip packaged dies until after fabrication is complete, it is necessary to recall that even a 13 mm×13 mm sized IC 10 die may include tens of thousands of circuits. Given the thousands of interconnections that are present in typical application specific ICs ("ASICs"), the likelihood of some interconnect layout errors can be high. Unfortunately, as is evident from FIG. 2, once the distribution layer is formed, it is impossible to change routing at the metal-one layer to correct errors or bugs in the fabricated IC because the metal-one layer is no longer accessible.

By way of example, consider logic unit 60, which includes NAND gates I-1, I-2, I-3 and a NOR gate I-4. Of course in an actual IC, there may be tens of thousands of such logic units. Assume that the circuit designer intended logic unit 60 to function as a mono-stable or one-shot. The two inputs to NOR gate I-4 were intended to be the input to NAND gate I-1 and an inverted and time-delayed version thereof, which is output from I-3.

Assume that post-fabrication testing indicates a consistent error in the output of NOR gate I-4 in logic unit 60. Given this post-fabrication testing result, the layout circuit designer suspects that a metal-one layout error is causing the error or bug in logic unit 60. Looking at the trace denoted 120-BUG on metal-one layer 110, it is believed that the source of the bug is that the INP-2 input lead to I-2 is inadvertently tied to ground, e.g., through via 100, through trace 120-BUG, through the distribution layer bump in the top row of bumps denoted 30-G. On NAND gate I-2, the pin denoted G indeed wants to be coupled to ground, but the INP-2 pin does not. Before ordering a revised layout of the metal-one trace, e.g., to sever trace 120-BUG between points A and B, it would be beneficially to actually re-test logic unit 60 with the severed trace. After all, because IC 10 could not be earlier tested, one does not know with certainty that IC 10 is not itself defective. Unfortunately, as is apparent from FIG. 2, once destination layer 140 is in place, no access to the underlying IC is possible for troubleshooting or repairs.

If access could somehow be provided, then focussed ion beam ("FIB") technology or the like could be used to break trace 120-BUG between points A and B. Once the trace were so broken, if further testing indicated that logic unit 60 (and indeed all other circuits on the IC) functioned satisfactorily, the circuit designer could with confidence order a new layout of the relevant portion of metal-one layer 110.

However, in prior art flip-chip architecture, the layout designer does not have the luxury of changing the metal-one layer once the distribution layer is in place. But until the distribution layer is fabricated, no testing to reveal metal-one layout errors can be undertaken. At best, the layout designer must use FIB (or equivalent) techniques to alter metal-one blindly, e.g., before attachment of the distribution layer and before testing the IC, and then complete fabrication. However, because the FIB-modified IC was not tested to begin with (since no testing can occur without the destination layer and full IC fabrication), the IC may be suspect, e.g., it may have defects beyond what is presently suspected to be defective.

Further, FIB removal of metal-one traces is a very time consuming operation, especially if many modifications to traces must be made. Indeed, it can take more than five hours to FIB-modify metal-one traces on a 13 mm×13 mm die. Once a die has been blindly selected (e.g., selected without benefit of testing), and FIB-modifications have been made, all non-modified ICs are useless, and typically are discarded. If FIB-modification results in a fully functioning IC, then changes are made on a production basis in the metal-one mask, and ICs are then mass produced. The inability to wafer probe test ICs used in flip-chip architecture results in production time delays, poor yield, and resultant higher costs to deliver mass produced ICs.

Thus, there is a need for a mechanism by which a flip-chip packaged die may be wafer probe tested, e.g., tested before fabrication of the destination layer occurs. Such a mechanism would expose the metal-one layer of such an IC to FIB or other modification and permit testing before as well as after the modification. Once a modification has been test-confirmed, the mass-produced metal-one layer pattern could be modified accordingly, with the result that substantially bug-free ICs are produced.

The present invention provides such a mechanism and a method for such testing.

SUMMARY OF THE PRESENT INVENTION

The present invention enables an IC that will be flip-chip packaged to be wafer probe tested, e.g., tested for functionality before fabrication of the destination layer. According to the invention, the metal-one layer is provided with at least one wafer probe contactable pad for VCC, for ground, and for testing. The VCC and ground pad(s) are electrically coupled using via(s) to appropriate power and ground nodes in the IC, and the test pad(s) are coupled using via(s) to appropriate test nodes in the IC.

Testing including JTAG-compatible testing is accommodated by fabricating a JTAG-compatible controller on the IC and by providing five test pads on the metal-one layer that are sized for wafer probe contact. A wafer probe couples VCC, ground, and test signals to these additional metal-one layer pads, thus enabling the underlying IC to be tested using the on-chip controller. If bugs are detected, through wafer probe testing or otherwise, the metal-one layer is still exposed to permit trace modification, e.g., using FIB, to correct the bugs. After any necessary FIB modification, the IC may be re-tested with the wafer probe to confirm that the error has been remedied. The destination layer is then fabricated and the completely fabricated IC may be re-tested. If re-testing confirms that the fully fabricated IC is bug free, the metal-one layout mask may be changed accordingly such that mass production produced ICs using the new mask will be bug free. The production-produced ICs preferably can include the additional metal-one layer pads used to implement the present invention.

Other features and advantages of the invention will appear from the following description in which the preferred embodiments have been set forth in detail, in conjunction with the accompanying drawings.

BRIEF DESCRIPTION OF THE DRAWINGS

FIG. 3A is a breakaway view of a flip-chip IC that includes probe-coupleable pads and traces on its metal-one layer, according to the present invention;

FIG. 3B is a breakaway view of the flip-chip IC of FIG. 3A showing FIB-modification to a metal-one trace to cure a bug, according to the present invention;

DETAILED DESCRIPTION OF THE PREFERRED EMBODIMENT

Figure 2:
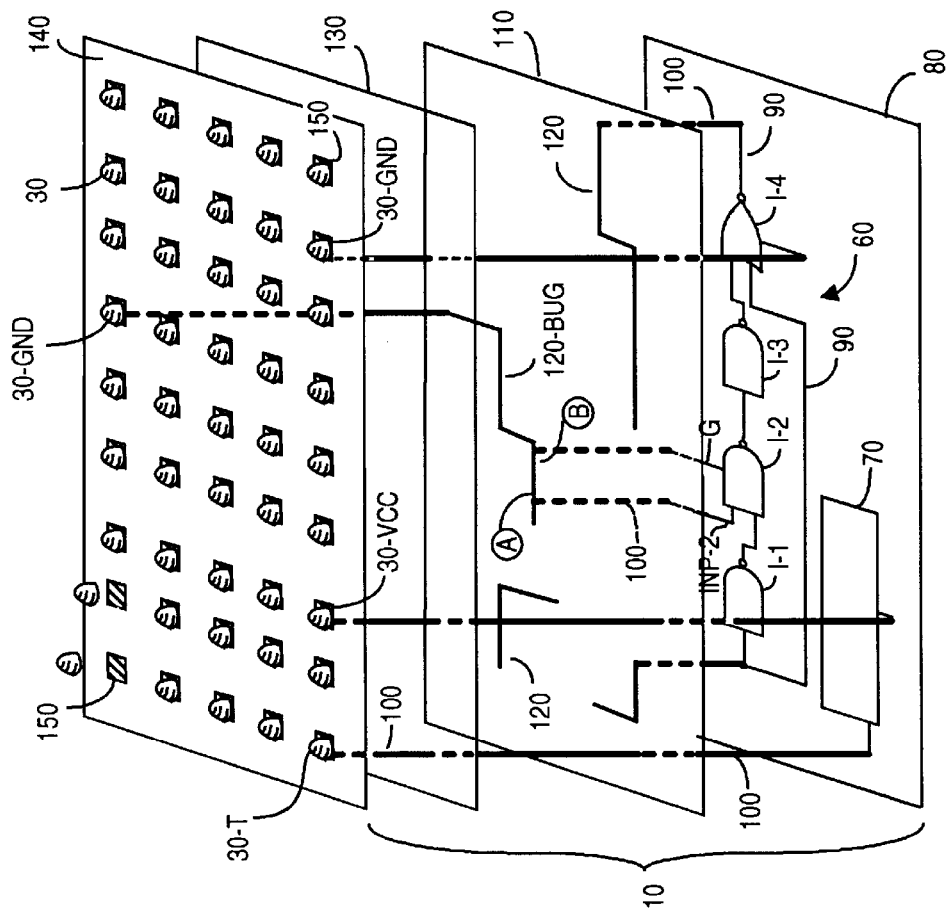
FIG. 2 is a breakaway view of a flip-chip IC, according to the-prior art.
Figure 3C:
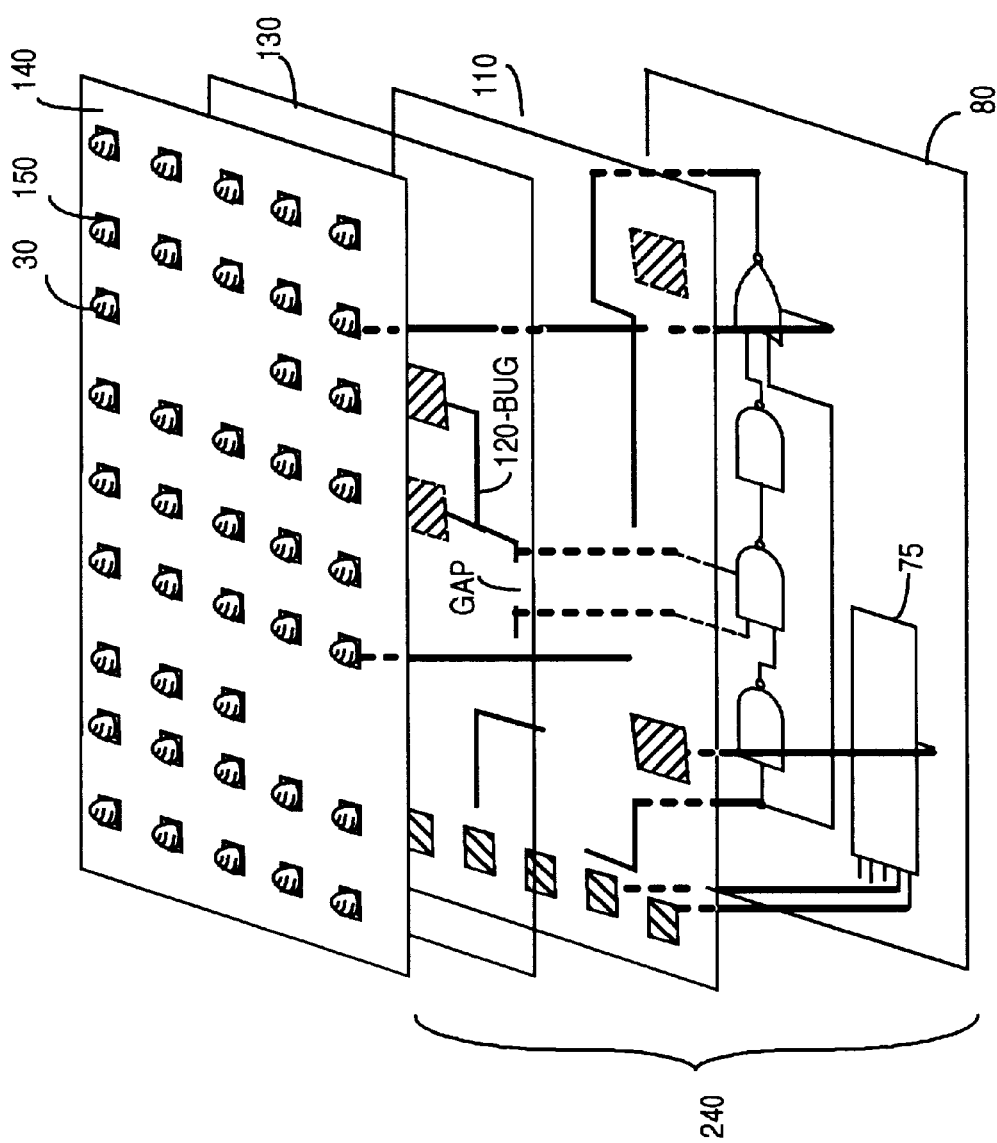
FIG. 3C is a breakaway view of the flip-chip IC of FIG. 3B showing attachment of the oxide and destination layers.

FIG. 3A depicts a partially fabricated IC 10', according to the present invention. Fabrication is incomplete in that insulating layer 130 and destination layer 140 are not yet fabricated. (Unless otherwise noted, reference elements in FIGS. 3A–3C that are identical those reference elements used to describe FIG. 1 and FIG. 2 may describe the same element.) For purposes of the present invention, circuits fabricated in IC 10', e.g., 90, 75, etc., may be fabricated using MOS, CMOS, bipolar, and/or bipolar-CMOS ("BiCMOS") techniques.

"Layer" 80 includes a controller 75 that preferably is a test access port ("TAP") compatible controller. Controller 75 may be fabricated as to implement I.E.E.E. Joint Test Action Group ("JTAG") testing, e.g., testing per the IEEE 1149.1 standard or a similar standard. A JTAG controller 75 will thus utilize typically five JTAG signals that the present invention will make available using five wafer-probe contactable pads JTAG-1, . . . JTAG-5 that are formed on metal-one layer 110. As used herein, a "wafer-probe contactable" pad means the pad is sized to permit contact with a wafer probe pin. A typical size will be at least about 70 $\mu m \times 70 \ \mu m$ to accommoate existing wafer probes. If wafer probes in the future can contact a smaller target, then such pads could be reduced in pad area. Of course controller 75 could be designed to implement non-JTAG compatible test protocols as well, in which case the number of wafer-probe contactable pads formed on the metal-one layer may be other than five, e.g., at least one such pad.

In addition, to forming at least one such test pad, the present invention also provides at least one wafer-probe contactable VCC pad e.g., VCC-1, and optionally (as shown in phantom) VCC-2, and at least one wafer-probe contactable ground pad, e.g., GND-1, and optionally (as shown in phantom) GND-2. Because the VCC and GND test pads will carry more current than the test pads, the VCC and GND pads preferably are sized somewhat larger than the test pads. The test pad(s), VCC pad(s), and ground pad(s) may be placed wherever convenient on the metal-one layer, and will be coupled through vias to appropriate nodes on the various circuits formed on "layer" 80.

Thus, but for the inclusion of a preferably TAP-compatible controller 75 and the fabrication of the above-described test pad(s), VCC pad(s), and ground pad(s), what is shown in partially fabricated IC 10' may be identically to what was shown in FIG. 2, through and including metal-one layer 110.

Also shown in FIG. 3A is a wafer probe unit 200, with a pluraltiy of probe pins, here denoted P-JTAG-1 . . . P-JTAG-5, P-VCC-1, and P-GND-1. These probe pins will contact, respectively, metal-one layer pads JTAG-1 . . . JTAG-5, VCC-1, and GND-1. Of course if multiple VCC and multiple ground pads are formed on the metal-one layer, according to the present invention, wafer probe unit 200 may utilize additional probe pins to contact these pins. It is apparent from FIG. 3A that wafer probe unit 200 has ready access to the metal-one layer and the above-described pads.

Circuitry or systems associated with wafer probe unit 200 provide VCC and ground through appropriate wafer probe pins to approrpirate VCC and GND wafer probe-contactable pads formed on the metal-one layer. Similarly, wafer probe unit 200 provides test signals through appropriate probe pin(s) to the wafer probe-contactable test pad(s) formed on the metal-one layer.

Thus, in FIG. 3A, IC 10' receives VCC, ground, and test signals from unit wafer probe 200, and may be fully tested, including testing with controller 75. Advantageously, controller 75 testing is relatively rapid, taking minutes or less to fully functionally test IC 10'. The reliability testing conducted by controller 75 upon the circuits fabricated in IC 10' may include a built-in-self-test ("BIST"), an auto test pattern generation test ("ATPG"), a logic BIST test, among other tests.

Thus, even though fabrication is not yet complete, IC 10' can be functionally tested using wafer probe unit 200. Assume that such wafer probe testing (or perhaps other testing) detects the logic unit 60 error described earlier with respect to the 120-BUG trace. In contrast to the prior art configuration of FIG. 2, the present invention enables a bug repair to be made at the metal-one layer, which is fully exposed and accessible.

As shown in FIG. 3B, a FIB unit 220 (or other process unit) has ready access to traces on the metal-one layer that the circuit designer believes should be broken, to test the repair of a detected bug. Thus, it is desired to break the 120-BUG trace between points A and B on the tested IC 10' to try to fix the bug. This option was simply not possible with the prior art configuration of FIG. 2 whose metal-one layer was not accessible. Accordingly, FIB unit 220 emits energy 230, which is focussed upon the target area, and breaks trace 120-BUG to produce the gap shown in FIG. 3B.

As noted, although wafer probe testing of IC 10' is relatively rapid, to fully FIB IC 10' may take many hours, especially if many repairs are undertaken. Those skilled in the art will appreciate that FIB unit 220 will cause the emitted energy to be repositioned to contact desired locations on the metal-one layer surface. The locations so contacted are removed, producing desired gaps in the traces.

After FIB repair is complete, wafer probe unit 200 may again be used to confirm functionality of IC 10' with the modified metal-one layer. If functionality is confirmed, insulation layer 130 and destination layer 140 are now fabricated, as shown in FIG. 3C, to produce fabricated IC 240. FIG. 3C also depicts that while landing sites 150 and solder bumps 30 will typically be found in an array, it is not necessary that the landing sites and bumps be formed at every array position. As was described, appropriate landing sites 150 are coupled by vias or the like to metal-one layer locations whereat VCC and GND are available, as well as to desired circuit signal nodes, e.g., the output of NOR gate I-4. For ease of illustration, only two such vias are shown in FIG. 3C.

To ensure that layer-one mask-modified IC 240 still functions reliably, IC 240 may now be tested, e.g., by soldering bumps 30 to a substrate bearing appropriate traces coupled to appropriate power supply, ground, and signal sources. If the fabricated IC is still fully functional, the metal-one mask may be modified to permanently include gaps or other changes proven effective from the wafer-probe testing. As a result, mass-produced ICs 240 will be free of the bugs that were detected at the partial fabrication stage shown in FIG. 3B.

Figure 1:
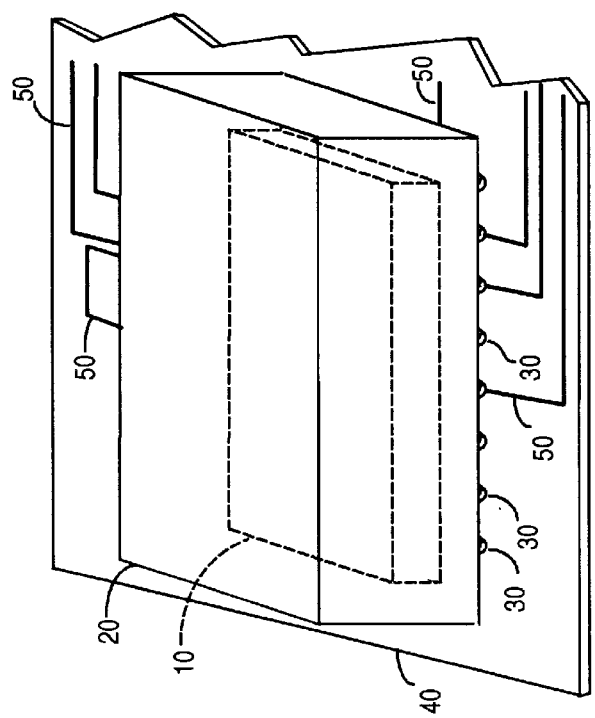
FIG. 1 depicts an installed flip-chip packaged IC, according to the prior art.

Preferably the mass-produced ICs 240 will still carry the wafer probe-contactable pads that were formed on the metal-one layer. There is little penalty is maintaining these pads on the mass-produced metal-one layer, and indeed, identity of functionality with ICs tested as shown in FIG. 3B is promoted. Removing one or more of these pads might, for example, slightly alter capacitive coupling that affects the packaged IC. A protective package 20 is added in conventional fashion and ultimately the packaged IC will be mounted to a substrate, as shown in FIG. 1.

Although flip-chip packaged circuitry typically in fabricated using MOS/CMOS, it will be appreciated that the present invention can also function with circuits implemented using bipolar and BiCMOS technology. It is also understood that multiple controllers may be fabricated on the IC, and that a great many tests may be conducted, especially if more than five test pins are provided. Further, if the IC circuitry requires more than VCC and ground potential, it is understood that additional wafer probe-sized contacts will be fabricated on the metal-one layer, to permit a wafer-probe unit (or equivalent) to provide the additional operating power sources for testing the IC.

Modifications and variations may be made to the disclosed embodiments without departing from the subject and spirit of the invention as defined by the following claims.

What is claimed is:

1. A method of wafer-probe testing functionality of a flip-chip packagable IC that includes an uppermost layer of metallization including conductive traces, over which uppermost layer a destination layer will eventually be formed, the method comprising the following steps:

(a) prior to formation of said destination layer, forming on said uppermost layer of metallization at least one VCC pad, at least one ground pad, and at least one test pad; wherein each said pad is sized to be wafer probe-contactable and is electrically coupled to at least one underlying node in said IC;

(b) prior to formation of said destination layer, coupling a source of VCC to said VCC pad, coupling a source of ground to said ground pad, and coupling a source of test signals to said test pad; and (c) using said VCC, said ground, and said test signals, to functionally test said IC.

2. The method of claim 1, wherein said IC includes a test controller coupled to said test pad, said test controller at least partially testing functionality of said IC at step (c).

3. The method of claim 2, wherein said test controller is IEEE test-compatible.

4. The method of claim 2, wherein said test controller is IEEE JTAG-compatible, and wherein step (a) includes providing five test pads.

5. The method of claim 2, wherein said test controller is employed at step (c) to carry out at least one functionality test selected from a group consisting of (i) a built-in-self-test, (ii) an auto test pattern generation test, and (iii) a logic built-in-self-test.

6. The method of claim 1, wherein at step (a) each said pad is sized to at least about 70 $\mu$m×70 $\mu$m, and wherein step (b) includes using a wafer probe unit to couple said source of VCC to said VCC pad, to couple said source of ground to said ground pad, and to couple said source of test signals to said test pad.

7. The method of claim 1, further including:
  (d) correcting an error in functionality discovered at step (c) by cutting at least one of said traces in said uppermost layer; and
  (e) repeating step (b) and step (c) to confirm correction of said error.

8. The method of claim 1, further including:
  (d) forming said destination layer over said uppermost metallization layer if functionality testing at step (c) confirms errorless functionality.

9. The method of claim 8, further including:
  (f) forming said destination layer over said uppermost layer after carrying out step (d).

10. A method of functionally testing a flip-chip packagable IC that includes an uppermost layer of metallization including conductive traces, over which conductive layer a destination layer will eventually be formed, said IC further including a test controller, the method comprising the following steps:

(a) prior to formation of said destination layer, forming on said uppermost layer of metallization at least one VCC pad, at least one ground pad, and at least one test pad;
    wherein each said VCC pad, ground pad, and test pad is sized to be wafer probe-contactable and is electrically coupled to at least one underlying node in said IC, said test paid being being electrically coupled to a node in said controller;
  (b) prior to formation of said destination layer, coupling a source of VCC to said VCC pad, coupling a source of ground to said ground pad, and coupling a source of test signals to said test pad; and
  (c) using said VCC, said ground, and said test signals to activate said controller to functionally test said IC.

11. The method of claim 10, wherein said controller is IEEE JTAG-compatible, and wherein at step (a) five test pads are formed on said uppermost layer of mettalization.

12. The method of claim 10, wherein said controller is employed at step (c) to carry out at least one functionality test selected from a group consisting of (i) a built-in-self-test, (ii) an auto test pattern generation test, and (iii) a logic built-in-self-test.

13. The method of claim 10, wherein step (b) includes using a wafer probe unit to couple said source of VCC to said VCC pad, to couple said source of ground to said ground pad, and to couple said source of test signals to said test pad.

14. The method of claim 10, further including:
  (d) correcting an error in functionality discovered at step (c) by cutting at least one of said traces in said uppermost layer; and
  (e) repeating step (b) and step (c) to confirm correction of said error.

15. The method of claim 10, further including:
  (d) forming said destination layer over said uppermost metallization layer if functionality testing at step (c) confirms errorless functionality.

* * * * *